(12) United States Patent
Shin et al.

(10) Patent No.: US 12,230,852 B2
(45) Date of Patent: Feb. 18, 2025

(54) WAVEGUIDE FILTER

(71) Applicant: KMW INC., Hwaseong-si (KR)

(72) Inventors: Yeon Ho Shin, Yongin-si (KR); Kwon Won Lee, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 268 days.

(21) Appl. No.: 17/676,247

(22) Filed: Feb. 21, 2022

(65) Prior Publication Data

US 2022/0173487 A1 Jun. 2, 2022

Related U.S. Application Data

(63) Continuation of application No. PCT/KR2020/008077, filed on Jun. 22, 2020.

(30) Foreign Application Priority Data

Aug. 30, 2019 (KR) .......................... 10-2019-0107581
Jun. 16, 2020 (KR) .......................... 10-2020-0072750

(51) Int. Cl.
*H01P 1/207* (2006.01)
*H01P 5/02* (2006.01)
*H03H 7/01* (2006.01)

(52) U.S. Cl.
CPC ................ *H01P 1/207* (2013.01); *H01P 5/02* (2013.01); *H03H 7/01* (2013.01); *H03H 2007/013* (2013.01)

(58) Field of Classification Search
CPC .... H03H 7/01; H03H 2007/013; H01P 1/207; H01P 5/02; H01P 1/2053; H01P 1/208
See application file for complete search history.

(56) References Cited

U.S. PATENT DOCUMENTS

| | | | |
|---|---|---|---|
| 5,537,082 A | 7/1996 | Tada et al. | |
| 5,926,079 A | 7/1999 | Heine et al. | |
| 10,027,007 B2* | 7/2018 | Baum | H01P 7/06 |
| 10,116,028 B2* | 10/2018 | Vangala | H01P 1/2138 |
| 10,483,608 B2* | 11/2019 | Vangala | H04L 5/1461 |

(Continued)

FOREIGN PATENT DOCUMENTS

| | | |
|---|---|---|
| CN | 201038288 Y | 3/2008 |
| CN | 101719578 A | 6/2010 |

(Continued)

OTHER PUBLICATIONS

Extended European Search Report mailed Sep. 6, 2023 from the European Patent Office for European Application No. 20756993.9.

(Continued)

*Primary Examiner* — Andrea Lindgren Baltzell
*Assistant Examiner* — Kimberly E Glenn
(74) *Attorney, Agent, or Firm* — Insight Law Group, PLLC; Seung Lee

(57) ABSTRACT

The present invention relates to a waveguide filter particularly including a filter housing having a plurality of resonance blocks, a plurality of resonators configured by resonator posts respectively formed on the resonance blocks provided on the filter housing, and a resonator tunnel provided in the filter housing and configured to apply cross-coupling at least two resonance blocks among the plurality of resonance blocks, thereby providing very simple design for implementing coupling for forming a notch.

19 Claims, 9 Drawing Sheets

(56) References Cited

U.S. PATENT DOCUMENTS

| | | |
|---|---|---|
| 2003/0102937 A1 | 6/2003 | Hiroshima et al. |
| 2010/0188171 A1 | 7/2010 | Mohajer-Iravani et al. |
| 2012/0286901 A1 | 11/2012 | Vangala |
| 2016/0072169 A1 | 3/2016 | Lin et al. |
| 2016/0301122 A1 | 10/2016 | Chun et al. |

FOREIGN PATENT DOCUMENTS

| | | | |
|---|---|---|---|
| CN | 103378388 A | | 10/2013 |
| CN | 103515678 A | | 1/2014 |
| CN | 103618122 A | | 3/2014 |
| CN | 106960994 A | | 7/2017 |
| CN | 109309272 A | | 2/2019 |
| CN | 110098456 A | | 8/2019 |
| CN | 110137638 A | | 8/2019 |
| CN | 213752988 U | | 7/2021 |
| JP | H07-249904 A | | 9/1995 |
| JP | H10-313202 A | | 11/1998 |
| JP | 2003-163506 A | | 6/2003 |
| JP | 2010-226469 A | | 10/2010 |
| JP | 2010-258893 A | | 11/2010 |
| JP | 2013-225787 A | | 10/2013 |
| JP | 2014-521278 A | | 8/2014 |
| KR | 10-0304357 B1 | | 9/2001 |
| KR | 2004-043447 A | | 5/2004 |
| KR | 10-2013-0003920 A | | 1/2013 |
| KR | 10-1756124 B | | 6/2017 |
| KR | 10-1756124 B1 | | 7/2017 |
| KR | 10-2018-0134830 A | | 12/2018 |

OTHER PUBLICATIONS

International search report mailed Sep. 17, 2020 for International application No. PCT/KR2020/008077 and its English translation.
Chinese Office Action mailed Nov. 2, 2022 for Chinese Application No. 202080060066.3.
Japanese Office Action mailed Mar. 7, 2023 from the Japanese Patent Office for Japanese Application No. 2022-512799.
Japanese office action dated Jun. 18, 2024 for the Japanese Application No. 2022-512799.

* cited by examiner (a)

(b)

(c)

WAVEGUIDE FILTER

CROSS-REFERENCE TO RELATED APPLICATIONS

This application is a Continuation of International Application No. PCT/KR2020/008077, filed on Jun. 22, 2020, which claims the benefit of and priority to Korean Patent Application Nos. 10-2019-0107581, filed on Aug. 30, 2019; and 10-2020-0072750, filed on Jun. 16, 2020, the disclosure of which are herein incorporated by reference in their entirety.

TECHNICAL FIELD

The present invention relates to a waveguide filter for an antenna, and more particularly, to a waveguide filter including a resonator and using cross-coupling.

BACKGROUND ART

Recently, a frequency environment becomes complicated as the number of types of wireless communication service increases. Because the number of frequencies for wireless communication is limited, it is necessary to effectively use frequency resources by making wireless communication channels adjacent as much as possible.

However, because signal interference occurs in an environment in which various types of wireless communication service are provided, the antenna including a band filter that has an effect on a particular band to minimize signal interference between the adjacent frequency resources.

In general, a transmission zero (hereinafter, referred to as a 'notch') is essentially applied to improve attenuation characteristics of the band filter, and the notch is implemented by applying cross-coupling between resonance elements which are not adjacent to each other.

A dielectric waveguide filter (ceramic waveguide filter), among RF filters, includes resonators for adjusting notches formed in a dielectric block having a periphery covered by a conductive film. The resonator is designed to restrict a particular frequency by providing resonance properties to electromagnetic waves.

In this case, vertically symmetrical notches of a passband are generally produced when cross-couplings are applied across the even-numbered resonators. Further, a single notch is generally produced at a left or right side according to types of couplings when the cross-couplings are applied across the odd-numbered resonators.

The notch of the communication filter is required to be much variously implemented according to the performance of a communication system, but the performance is limited in implementing a filter suitable for the properties of the communication system.

Therefore, the filter needs to be differently set according to the communication system in order to implement notches at left and right sides of a particular passband of an antenna.

In particular, in a case in which a strong coupling needs to be applied to the left side, which is not vertically symmetric, and a weak coupling needs to be applied to the right side at the time of implementing the notches at the left and right sides of the passband by using a single cross-coupling, two cross-coupling structures are inevitably used. The implementation of the two cross-couplings acts as large restriction on filter design. In particular, the implementation of the two cross-couplings causes a severer problem in a ceramic filter structure in which it is difficult to insert an additional structure for implementing the cross-coupling in the filter.

In addition, to satisfy desired properties by implementing the two notches at the left or right sides of the passband, the two cross-couplings passing through the odd-numbered resonators need to be implemented, which results in large restriction on design.

DISCLOSURE

Technical Problem

The present invention has been made in an effort to solve the above-mentioned problems, and an object of the present invention is to provide a waveguide filter, in which properties of a particular passband are enhanced by implementing coupling by using a resonator tunnel that connects resonator posts.

Technical problems of the present invention are not limited to the aforementioned technical problems, and other technical problems, which are not mentioned above, may be clearly understood by those skilled in the art from the following descriptions.

Technical Solution

An embodiment of the present invention provides a waveguide filter including: a filter housing having a plurality of resonance blocks; a plurality of resonators configured by resonator posts respectively formed on the resonance blocks provided on the filter housing; and a resonator tunnel provided in the filter housing and configured to connect at least two resonator posts, among the plurality of resonator posts, to couple the two resonator posts, the two resonator posts being provided on one surface and the other surface of the filter housing so as to be reversed with respect to each other.

In this case, the two resonator posts connected by the resonator tunnel may be disposed to be reversed with respect to each other to enable vicinal coupling.

In addition, the two resonator posts connected by the resonator tunnel may be disposed to be reversed with respect to each other to enable cross-coupling.

In addition, the resonator tunnel may include a horizontal resonator tunnel disposed in the filter housing and configured to penetrate the filter housing in a width direction or a longitudinal direction and connect at least two resonator posts.

In addition, the resonator tunnel may further include a vertical resonator tunnel configured to vertically penetrate the filter housing and connected to the horizontal resonator tunnel.

In addition, the resonator tunnel may further include a resonator extension tunnel extending from the horizontal resonator tunnel and opened in a direction of one surface or the other surface of the filter housing.

The horizontal resonator tunnel may be inclined in the width direction of the filter housing.

In addition, the resonator tunnel may be formed in the filter housing so as to be mirror-symmetric with respect to a center between the two resonator posts.

In addition, a tuning resonator post for tuning adjustment may be further provided on a surface of any one of the two resonator posts, the surface facing the filter housing.

In addition, the plurality of resonance blocks may be separated by plurality of partition walls or a plurality of partition slots formed between the respective resonance blocks.

In addition, the resonator tunnel may connect the two resonator posts, which are adjacent to each other in a width direction of the filter housing, to apply cross-coupling to the two resonator posts.

In addition, the resonator tunnel may connect the two resonator posts, which are adjacent to each other in a longitudinal direction of the filter housing, to apply vicinal coupling to the two resonator posts.

In addition, a notch may be formed by inductive coupling by the resonator tunnel, and a formation position of the notch may be adjusted by a shape and size of the resonator tunnel.

Advantageous Effects

The waveguide filter according to the embodiment of the present invention may achieve the following various effects.

That is, the present invention may easily design the filter and improve the properties of the filter by implementing the notches according to the properties of two opposite sides of the particular passband by implementing the coupling by connecting the plurality of resonator posts with the resonator tunnel.

In addition, the present invention may set the cross-coupling or the vicinal coupling in a limited space by using the horizontal resonator tunnel.

In addition, the present invention may change the properties of the filter by changing the properties of the cross-coupling or the vicinal coupling by changing the positions or shapes of the horizontal resonator tunnel and the vertical resonator tunnel.

In addition, the present invention may form the notch at the left or right side of the passband by using desired properties by changing the positions or shapes of the horizontal resonator tunnel and the vertical resonator tunnel.

In addition, the present invention may easily design the filter regardless of types of dielectric materials of the waveguide filter that uses ceramic or air as the dielectric material.

In addition, the present invention may have the vertical resonator tunnel penetratively formed in the thickness direction of the filter housing or the horizontal resonator tunnel penetratively formed in the width direction of the filter housing, thereby implementing various types of performance of the filters according to the positions and shapes of the tunnel.

In addition, the present invention may reduce the manufacturing costs and increase the productivity by simplifying the complexity of the filter.

Figure 1A:
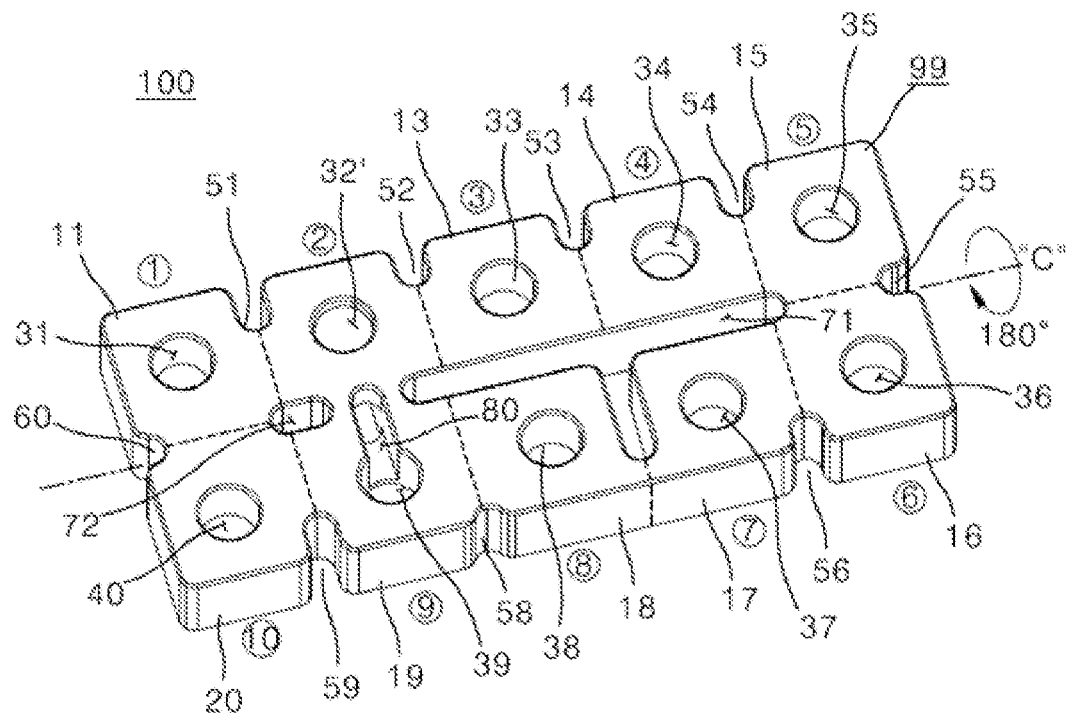
FIGS. 1A and 1B are one side perspective view and the other side perspective view illustrating a waveguide filter according to an embodiment of the present invention.

DESCRIPTION OF MAIN REFERENCE NUMERALS OF DRAWINGS 1 to 10: First to tenth resonators
11 to 20: First to tenth resonance blocks
21: Input post
22: Output post
31 to 40: First to tenth resonator posts
51 to 60: Partition walls
71, 72: Partition slots
80: Resonator tunnel
81: Horizontal resonator tunnel
82: Vertical resonator tunnel
99: Filter housing
100: Waveguide filter

BEST MODE

Advantages and features of the present invention and methods of achieving the advantages and features will be clear with reference to embodiments described in detail below together with the accompanying drawings. However, the present invention is not limited to the exemplary embodiments disclosed herein but will be implemented in various forms. The exemplary embodiments of the present invention are provided so that the present invention is completely disclosed, and a person with ordinary skill in the art can fully understand the scope of the present invention. The present invention will be defined only by the scope of the appended claims. Throughout the specification, the same reference numerals denote the same constituent elements.

Hereinafter, an embodiment of a waveguide filter according to the present invention will be described in detail with reference to the accompanying drawings.

Figure 1B:
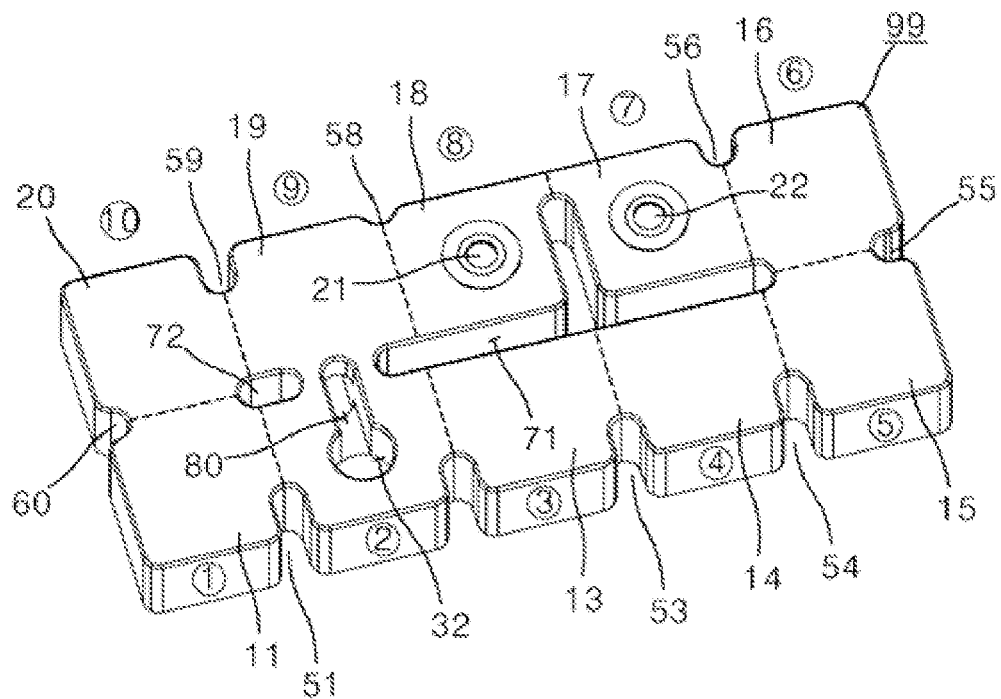
Figure 2A:
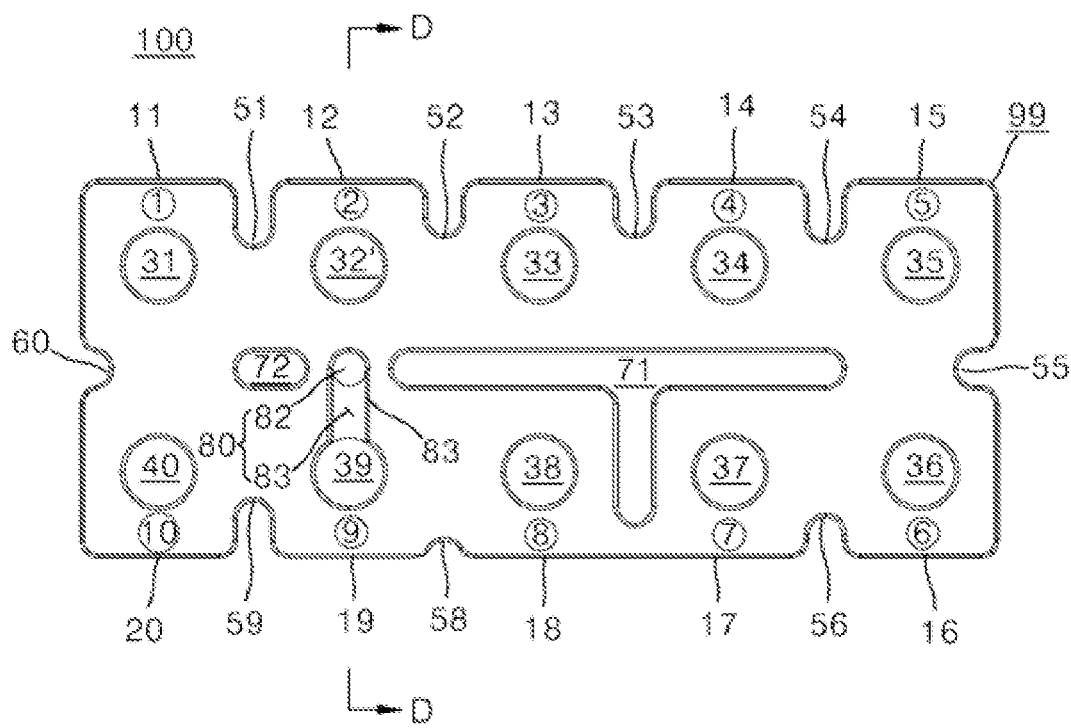
FIGS. 2A and 2B are one side top plan view and the other side top plan view of FIGS. 1A and 1B.
Figure 2B:
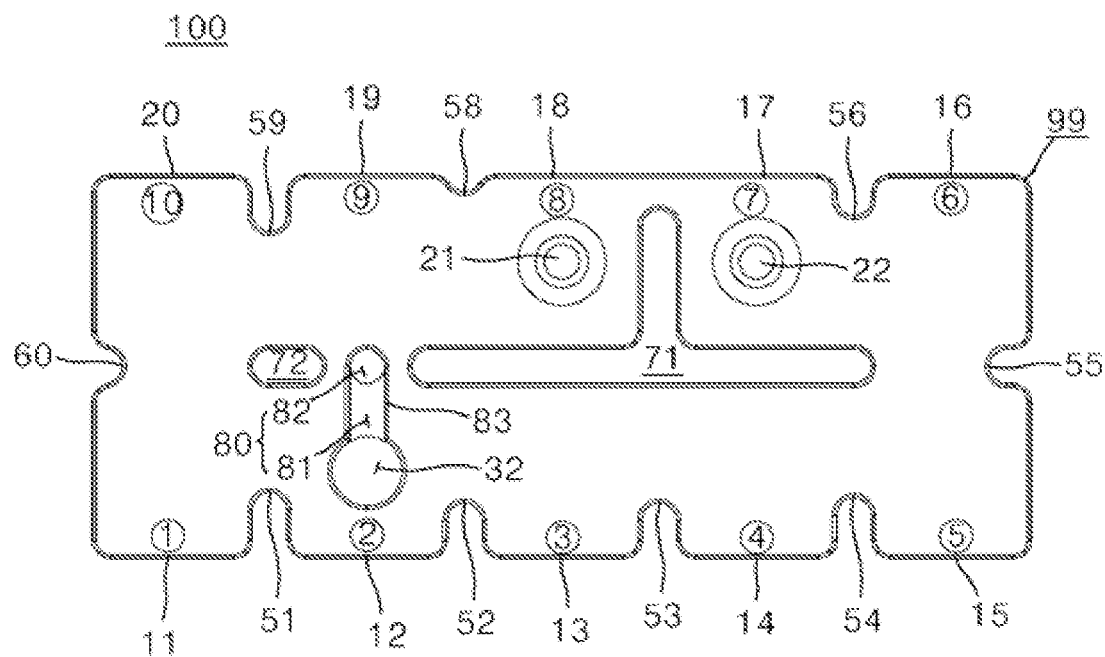

FIGS. 1A and 1B are one side perspective view and the other side perspective view illustrating a waveguide filter according to an embodiment of the present invention, FIGS. 2A and 2B are one side top plan view and the other side top plan view of FIGS. 1A and 1B, and FIGS. 3A and 3B are a cross-sectional view and a cut-away perspective view taken along line D-D in FIG. 2.

In particular, FIG. 1B is a view illustrating a state in which a filter housing 99 illustrated in FIG. 1A is rotated about a "C"-axis by 180 degrees.

A communication antenna includes a radio frequency (RF) filter configured to filter a signal of a particular passband. A cavity filter, a waveguide filter, and the like may be used according to properties of the RF filter. However, an embodiment and another embodiment of the present invention will be described below, focusing on a waveguide filter provided in an antenna.

In general, a waveguide filter 100 includes at least four (i.e., four or more) resonance blocks. For example, the single filter housing 99 may include four to twenty resonance blocks.

As illustrated in FIGS. 1A to 3B, in the embodiment of the present invention, an example will be described in which the single filter housing 99 has ten resonance blocks 11 to 20.

As illustrated in FIGS. 1A to 4, the waveguide filter 100 according to the embodiment of the present invention may include the filter housing 99 having an approximately rectangular parallelepiped shape having a predetermined thickness and a predetermined length.

As described above, the adjacent resonance blocks among the ten resonance blocks 11 to 20 of the filter housing 99 may be separated by partition walls 51 to 60 or partition slots 71 and 72.

The resonance blocks 11 to 20, which are separated by the partition walls 51 to 60 or the partition slots 71 and 72, need not necessarily, physically, and completely separated. The resonance blocks may be separated to the extent that the adjacent resonance blocks are distinguishable in view of external shapes of the particular resonance blocks.

In this case, the interior of each of the resonance blocks 11 to 20 may be filled with a dielectric material, and ceramic or air may be used as the dielectric material.

However, the dielectric material is not necessarily limited to ceramic or air, and other dielectric materials may of course be used.

Each of the plurality of resonance blocks 11 to 20 may operate as one resonator 1 to 10, and the ten resonance blocks 11 to 20 may constitute the waveguide filter 100 including the ten resonators 1 to 10.

Meanwhile, the resonance blocks 11 to 20 may have the resonator posts 31 to 40, respectively. Hereinafter, the respective resonance blocks 11 to 20 will be referred to as a first resonance block 11, a second resonance block 12 . . . , and a tenth resonance block 20 numbered in a clockwise direction from a left upper end in FIG. 1A, and the resonator posts 31 to 40 respectively provided on the resonance blocks 11 to 20, which correspond to the ordinal numbers, will also be referred to as a first resonator post 31, a second resonator post 32 . . . , and a tenth resonator post 40 numbered. Unless otherwise described, the same ordinal numbers may also be assigned to the partition walls 51 to 60.

The resonator posts 31 to 40 may be provided on upper-end surfaces or lower-end surfaces of the resonance blocks 11 to 20. For example, in a case in which the first resonator post 31 is installed on one surface of the first resonance block 11, each of the resonator posts 32 to 40 may also be installed on one surface of each of the respective resonance blocks 12 to 20.

In this case, the configuration in which the resonator posts 31 to 40 are "installed" needs to be differently defined depending on the type of dielectric material with which the filter housing 99 is filled.

For example, in a case in which air is adopted so that the dielectric material has permittivity of air, the resonator posts 31 to 40 are provided by eliminating or removing the corresponding portions of the filter housing 99. Therefore, the term "installed" may have the same meaning as the term "formed".

As another example, the remaining dielectric materials, except for air among the dielectric materials, are fixed by filling, in a state of being physically cured, the corresponding portions of the filter housing 99. Therefore, the term "installed" may be understood as an inherent meaning.

Meanwhile, in the embodiment of the present invention, the ninth resonator post 39 and a second resonator post 32' requiring cross-coupling may be respectively formed on different surfaces of the filter housing 99.

In more detail, the first resonator post 31 and the third to tenth resonator posts 33 to 40, except for the second resonator post 32, may be formed on one surface of the filter housing 99, and only the second resonator post 32 may be formed on a lower surface of the filter housing 99.

The tuning resonator post 32' may be formed on the same surface as the ninth resonator post 39 and disposed at a position on the opposite surface of the filter housing 99 which is opposite to a position at which the second resonator post 32 is positioned. The second resonator post 32 and the tuning resonator post 32' correspond only in position to each other but are not connected to each other.

In more detail, the second resonator post 32 may be provided in the form of a groove cut out by a predetermined depth (hereinafter, referred to as a 'first depth') toward one surface from the other surface opposite to one surface of the two surfaces of the filter housing 99, one surface on which the other resonator posts 31 and 33 to 40 are formed. The tuning resonator post 32' may be provided in the form of a groove cut out by a predetermined depth (hereinafter, referred to as a 'second depth') toward the other surface from one surface of the two surfaces of the filter housing 99, one surface on which the other resonator posts 31 and 33 to 40 are formed.

In this case, the second depth of the tuning resonator post 32' may be relatively smaller than the first depth of the second resonator post 32 because it is acceptable if tuning design may be made by a tuning screw (not illustrated).

In this case, a sum of the first depth of the second resonator post 32 and the second depth of the tuning resonator post 32' may be smaller than a length between one surface and the other surface of the filter housing 99 (i.e., a thickness of the filter housing 99) because the second resonator post 32 and the tuning resonator post 32' should not penetrate the filter housing 99.

The first to tenth resonance blocks 11 to 20 are respectively coupled to the first to tenth resonator posts 31 to 40 and each operate as a single resonator. Therefore, first resonator to tenth resonators ① to ⑩ may be formed.

As described above, the partition walls 51 to 60 or the partition slots 71 and 72 are formed between the resonance blocks 11 to 20, and the sizes and resonance properties of the respective resonance blocks 11 to 20 may vary depending on the size (widths and lengths) and positions of the partition walls 51 to 60 or the partition slots 71 and 72.

For example, the second resonance block 12 may be separated by the first and second partition walls 51 and 52 from the first and third resonance blocks 11 and 13 respectively positioned at the left and right sides. The second resonance block 12 may be separated by the first and second partition slots 71 and 72 from the ninth resonance block 19 adjacent to the second resonance block 12 in a width direction.

Meanwhile, the waveguide filter 100 may further include an input post 21 to which a signal is inputted, and an output post 22 from which a signal is outputted.

The input post 21 and the output post 22 may be provided on different resonance blocks (in more detail, the input post 21 is provided on the eighth resonance block 18 and the output post 22 is provided on the seventh resonance block 17). The input post 21 and the output post 22 may be installed on any one of the surfaces of the resonance blocks 11 to 20. The embodiment of the present invention will be described on the premise that the input post 21 and the output post 22 are formed on the other surface of the filter housing 99.

Meanwhile, the waveguide filter 100 may further include a horizontal resonator tunnel 81 and a vertical resonator tunnel 82 configured to implement the cross-coupling between the particular resonance blocks (in the present embodiment, the second resonance block 12 and the ninth resonance block 19).

Hereinafter, as necessary, the horizontal resonator tunnel 81 and the vertical resonator tunnel 82 will be collectively referred to as a "resonator tunnel", denoted by reference numeral 80, and described.

As illustrated in FIGS. 1A to 3B, the resonator tunnel 80 may be penetratively formed in the width direction of the filter housing 99 and serve to connect the second resonator post 32 and the ninth resonator post 39 to implement the cross-coupling. A physical interval between the second resonator post 32 and the ninth resonator post 39 is shortened by the resonator tunnel 80.

Figure 5:
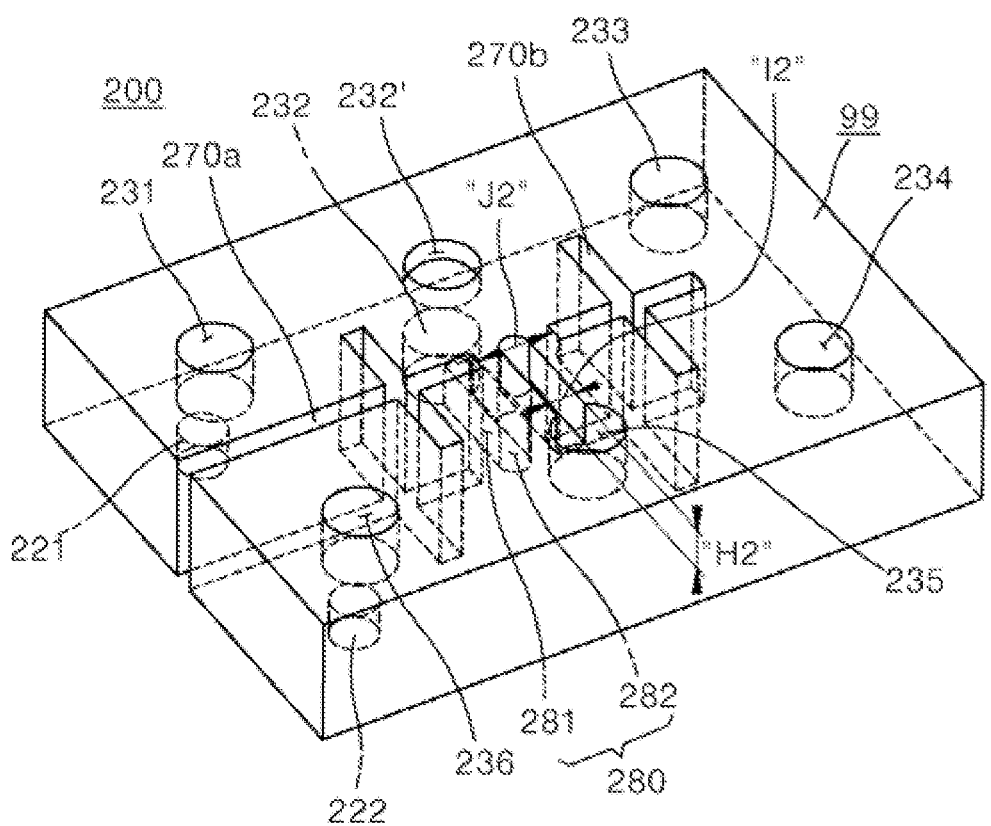
FIG. 5 is a schematic view for explaining a change in frequency properties depending on a depth of a resonator tunnel, a width of the resonator tunnel, and a spacing distance between the resonator tunnel and a partition slot in a configuration of the waveguide filter according to the embodiment of the present invention.

In more detail, as illustrated in FIG. 5, when a thickness direction of the filter housing 99 is defined as a 'vertical direction' and a width direction of the filter housing 99 is defined as a 'horizontal direction', the resonator tunnel 80 may include the horizontal resonator tunnel 81 configured to connect the second resonator post 32 and the ninth resonator post 39 in the horizontal direction, and the vertical resonator tunnel 82 configured to connect one surface and the other surface of the filter housing 99 in the vertical direction at a middle portion of the horizontal resonator tunnel 81.

Figure 3A:
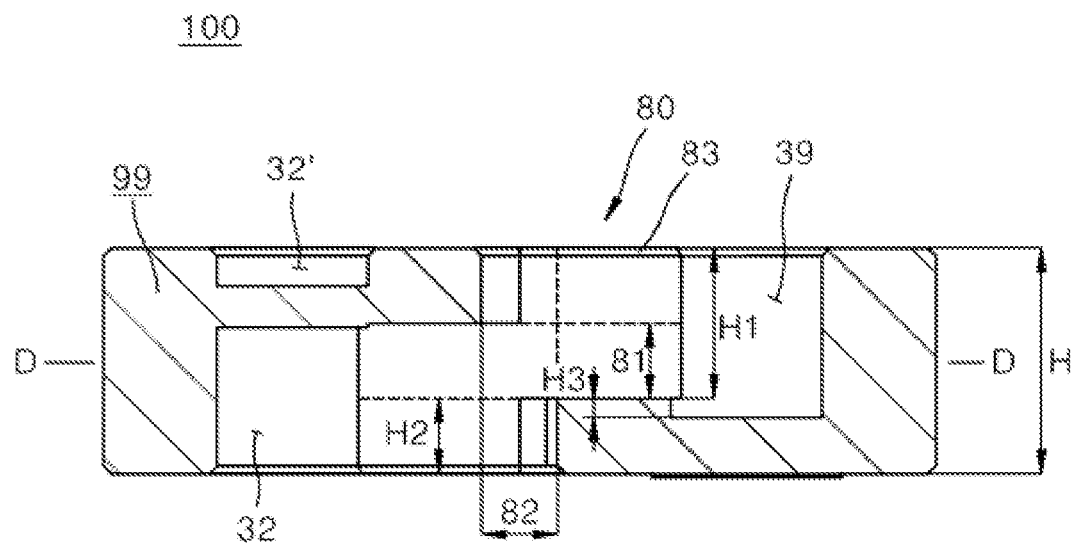
FIGS. 3A and 3B are a cross-sectional view and a cut-away perspective view taken along line D-D in FIG. 2A.
Figure 3B:
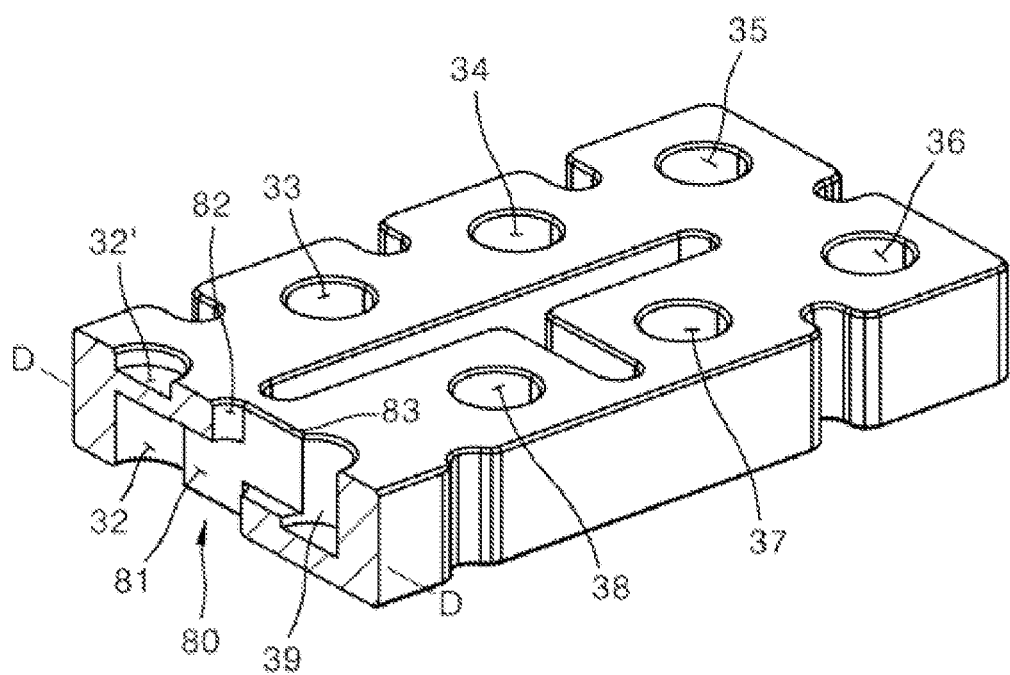

Further, as illustrated in FIGS. 3A and 3B, the resonator tunnel 80 may further include a resonator extension tunnel 83 extending from the horizontal resonator tunnel 81 in a direction toward one surface of the filter housing 99 or a direction toward the other surface of the filter housing 99.

The horizontal resonator tunnel 81 and the resonator extension tunnel 83 may have the same width and be formed by eliminating (or removing) a part of the filter housing 99. In this case, for the convenience of description, the description will be made on the assumption that a distance from the upper or lower surface of the filter housing 99 to a bottom surface of the horizontal resonator tunnel 81 is defined as a 'depth' of the resonator tunnel 80. The depth of the resonator tunnel 80 may be equal to or smaller than a depth of the second resonator post 32 or the ninth resonator post 39.

Further, the description will be made on the assumption that a width in a direction orthogonal to the extension direction of the horizontal resonator tunnel 81 or the resonator extension tunnel 83 is defined as a 'width' of the resonator tunnel 80.

The two resonators 32 and 39 may be subjected to cross-coupling by using the structure in which the second resonator post 32 and the ninth resonator post 39 are connected to each other by the resonator tunnel 80.

From a technical point of view, the capacitive coupling (C-Coupling) is implemented by a reversal effect made by the shape of the resonator post (e.g., the ninth resonator post 39) opened toward the upper surface of the filter housing 99 and the shape of the resonator post (e.g., the second resonator post 32) opened toward the lower surface of the filter housing 99. However, the waveguide filter according to the embodiment of the present invention is technically characterized in that inductive coupling (L-Coupling) is implemented by connecting the resonator posts (the ninth resonator post 99 and the second resonator post 32), which are reversed with respect to each other, by means of the resonator tunnel 80.

In this case, in the embodiment of the present invention, the structure in which the resonator tunnel 80 connects the second resonator post 32 and the ninth resonator post 39 has been described as an example. However, the resonator posts connected to each other may be changed depending on the design of the position of the cross-coupling intended to be implemented.

That is, although not illustrated in the drawings, the resonator tunnel 80 may be formed to implement coupling between the first resonator post 31 and the tenth resonator post 40 formed opposite to the first resonator post 31, between the third resonator post 33 and the eighth resonator post 38 formed opposite to the third resonator post 33, and the like.

In addition, in the embodiment of the present invention, the example has been described in which the cross-coupling is applied by the structure in which the resonator tunnel 80 connects the second resonator post 32 and the ninth resonator post 39. However, as described below with reference to FIG. 8, the resonator posts connected to each other may implement vicinal coupling between the adjacent resonator posts according to the type of coupling to be implemented.

In this case, the 'vicinal coupling' means couplings between the plurality of resonator posts sequentially arranged according to a flow of a signal from the input post 21 to the output post 22, and the coupling applied across at least one resonator post may be defined as the 'cross-coupling'.

As illustrated in FIG. 3A, the horizontal resonator tunnel 81 of the resonator tunnel 80 may be defined as a width direction connection section of the filter housing 99 having a width and a depth (H1 or less) smaller than an inner diameter of the ninth resonator post 39 and an inner diameter of the second resonator post 32.

However, the horizontal resonator tunnel 81 may be opened to one surface of the filter housing 99 and the other surface of the filter housing 99 through the resonator extension tunnel 83 formed in a part of a portion disposed adjacent to the second resonator post 32 and the ninth resonator post 39.

In this case, when the thickness of the filter housing is defined as 'H', a depth (H1) of the horizontal resonator tunnel 81 may be defined as a value obtained by subtracting a thickness H2 from the other surface of the filter housing 99 to the bottom surface of the horizontal resonator tunnel 81 from the thickness H of the filter housing 99 or a value obtained by subtracting a distance H3 between the bottom surface of the ninth resonator post 39 and the bottom surface of the horizontal resonator tunnel 81 from the thickness H of the filter housing 99.

Meanwhile, the vertical resonator tunnel 82 may have a spatial shape that penetrates, in the vertical direction (thickness direction), the lower surface of the filter housing 99 adjacent to the second resonator post 32 and is connected to the horizontal resonator tunnel 81 therein. Further, the vertical resonator tunnel 82 may have a spatial shape that penetrates, in the vertical direction (thickness direction), the upper surface of the filter housing 99 adjacent to the ninth resonator post 39 and is connected to the horizontal resonator tunnel 81 therein.

A radius of one side and a radius of the other side of the vertical resonator tunnel 82 are shared with the resonator extension tunnel 83 adjacent to the vertical resonator tunnel 82 in the horizontal direction (width direction), such that a circumferential space, which entirely penetrates the filter housing 99 in the vertical direction, may be made.

Further, in the embodiment of the present invention, the vertical resonator tunnel 82 has been described as being provided in the form of a hole having a circular cross-section. However, the vertical resonator tunnel 82 may of course have any one of quadrangular and polygonal cross-sectional shapes, and the size, width, or depth of the vertical resonator tunnel 82 may vary to adjust the amount of inductive coupling to be described below.

Meanwhile, in the embodiment in which the resonator extension tunnel 83 is not provided (see an application example illustrated in FIG. 7A to be described below), the vertical resonator tunnel 82 allows one surface and the other surface of the filter housing 99 to communicate with each other by penetrating the horizontal resonator tunnel 81 formed therein.

The vertical resonator tunnel 82 need not be an essential component of the resonator tunnel 80, and it is possible to implement an embodiment in which only the horizontal resonator tunnel 81 is provided (see an application example illustrated in FIG. 7C to be described below).

As illustrated in FIGS. 1A to 2B, the resonator tunnel 80 may have a mirror-symmetrical shape with respect to the second resonator post 32 and the ninth resonator post 39 when the filter housing 99 is rotated by 180 degrees about an axis indicated by reference numeral "C".

That is, as illustrated in FIG. 3A and FIG. 3B, the second resonator post 32 and the ninth resonator post 39 may be designed to have different depths. However, the resonator tunnel 80 may be completely mirror-symmetric in a diagonal direction with respect to a reference line passing in the vertical direction through a center between the second resonator post 32 and the ninth resonator post 39.

Meanwhile, the tuning resonator post 32', to which the tuning screw (not illustrated) is coupled, may be provided in the form of a groove in any one of one surface of the filter housing 99 facing the second resonator post 32 and the other surface of the filter housing 99 facing the ninth resonator post 39. In the embodiment of the present invention, the embodiment has been described in which the tuning resonator post 32' is provided on one surface of the filter housing 99 facing the second resonator post 32. However, the present invention is not necessarily limited thereto, and the tuning resonator post may be provided on the other surface of the filter housing 99 facing the ninth resonator post 39.

Figure 4:
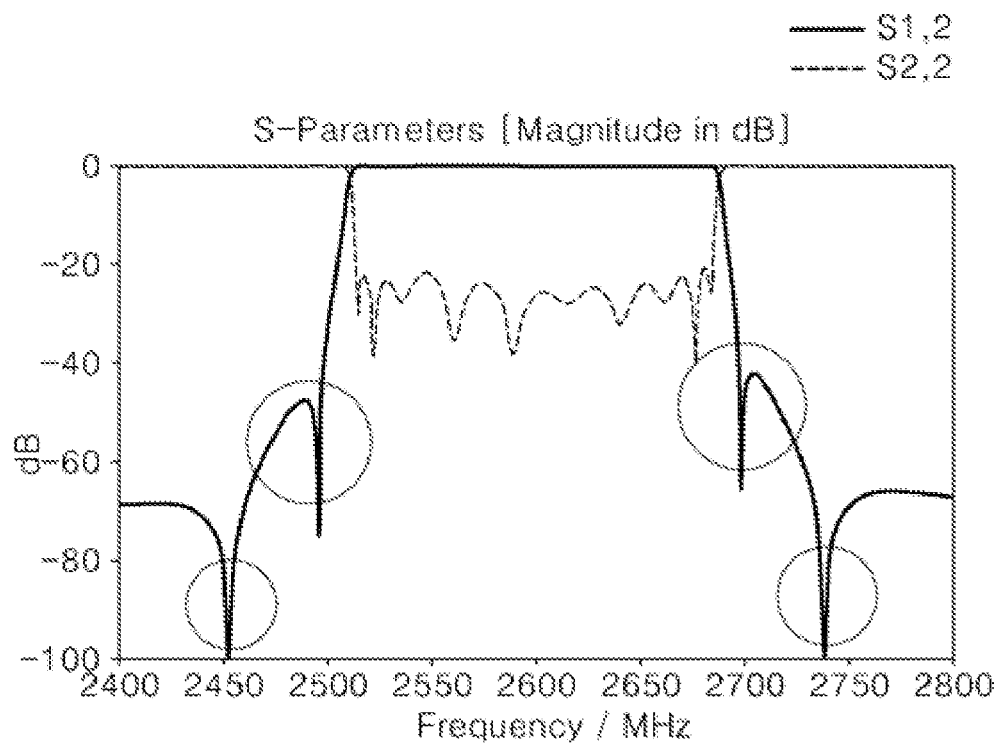
FIG. 4 is a graph illustrating a plot related to frequency properties of the waveguide filter according to the embodiment of the present invention.

FIG. 4 is a graph illustrating a plot related to properties of the waveguide filter according to the present invention. The horizontal axis indicates a frequency, and the vertical axis indicates a cut-off performance (dB) of the filter.

As illustrated in FIGS. 1A to 3B, according to the waveguide filter 100 according to the embodiment of the present invention, one surface and the other surface of the filter housing 99 are connected to each other by the resonator tunnel 80 mirror-symmetrically formed with respect to one surface and the other surface of the filter housing 99. Therefore, as illustrated in FIG. 4, two notches may be implemented at each of the two opposite sides of a passband by the cross-coupling in signal properties.

As described above, the implemented notches may be freely positioned at lower and upper sides of the passband of the filter by changing the depth or shape of the second resonator post 32 or the ninth resonator post 39 and the shape and position of the resonator tunnel 80 which are related to the formation of notches.

Figure 6:
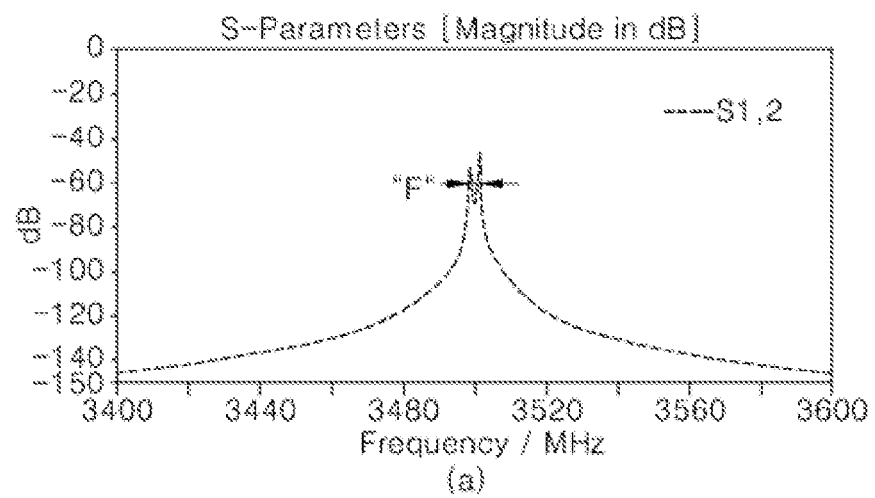
FIG. 6 a graph illustrating a plot related to frequency properties with respect to a change in depth of the resonator tunnel among the elements illustrated in FIG. 5.
Figure 6:
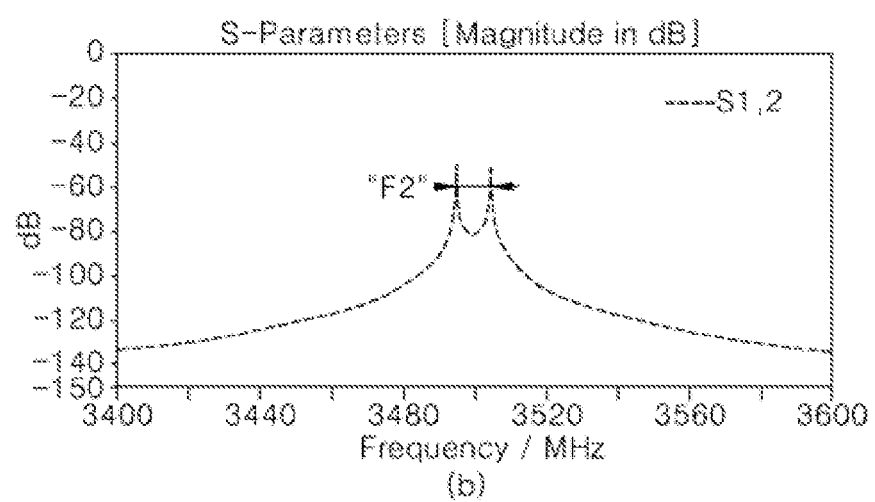
Figure 6:
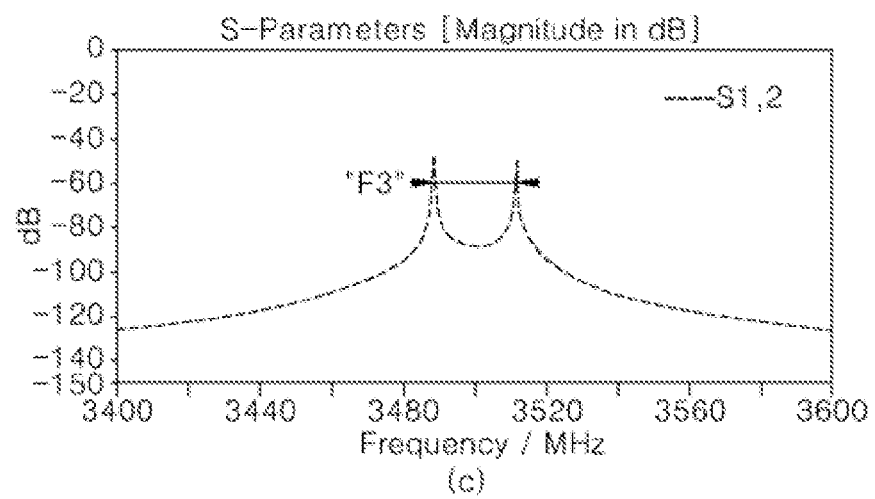

FIG. 5 is a schematic view for explaining a change in frequency properties depending on a depth of the resonator tunnel, a width of the resonator tunnel, and a spacing distance between the resonator tunnel and the partition slot in the configuration of the waveguide filter according to the embodiment of the present invention, and FIG. 6 a graph illustrating a plot related to frequency properties with respect to a change in depth of the resonator tunnel among the elements illustrated in FIG. 5.

Unlike the waveguide filter 100 according to the embodiment of the present invention illustrated in FIGS. 1A to 3B, a waveguide filter 200 illustrated in FIG. 5 is made to explain a result derived from the shape of the resonator tunnel 280. Therefore, the waveguide filter 200 is manufactured by relatively simplifying the structure thereof.

For example, the waveguide filter 100 according to the embodiment of the present invention has all the partition walls 51 to 60 and the partition slots 71 and 72 to separate the resonance blocks, whereas the waveguide filter 200 illustrated in FIG. 5 has only the partition slots 270a and 270b to separate the resonance blocks without having the partition wall.

In addition, the waveguide filter 200 illustrated in FIG. 5 is manufactured to have six resonance blocks so that the resonator posts 231 to 236 are provided on the resonance blocks, respectively.

Further, a first resonator post 231, a second resonator post 232, a third resonator post 233, a fourth resonator post 234, a fifth resonator post 235, and a sixth resonator post 236 are provided in this order along signal lines of an input post 221 and an output post 222. The second resonator post 232 is installed on the other surface of the filter housing 99, which is different from one surface of the filter housing 99 that defines installation surfaces for the resonator posts 231 and 233 to 236, and then reversed. A tuning post 232' is provided on one surface of the filter housing 99 which is opposite to the second resonator post 232.

In addition, the waveguide filter 200 illustrated in FIG. 5 is configured such that the second resonator post 232 and the fifth resonator post 235 communicate with each other through the resonator tunnel 280. Like the waveguide filter 100 according to the embodiment of the present invention illustrated in FIGS. 1A to 3B, the waveguide filter 200 illustrated in FIG. 5 may have a horizontal resonator tunnel 281, a vertical resonator tunnel 282, and a resonator extension tunnel 283.

In this case, the description will be made on the assumption that a width of the horizontal resonator tunnel 281 or the resonator extension tunnel 283 is defined as "I2", a depth including the horizontal resonator tunnel 281 and the resonator extension tunnel 283 is defined as "H2", and a spacing distance between partition slots 270a and 270b with the vertical resonator tunnel 282 interposed therebetween is defined as "J2", as illustrated in FIG. 5.

FIG. 6 illustrates a frequency property plot indicating a coupling effect between the second resonator post 232 and the fifth resonator post 235 in cases in which "H2", among the above-defined dimensions, is increased by 1 mm (see FIG. 6A), 1.5 mm (see FIG. 6B), and 2 mm (see FIG. 6C).

As illustrated in FIG. 6, it can be seen that the amount of coupling gradually increases (i.e., an increase in lengths of F1-F2-F3 in FIG. 6) as the depth of the horizontal resonator tunnel 281 gradually increases (i.e., increases in the order of 1 mm-1.5 mm-2 mm).

Meanwhile, although not illustrated in the drawings, there was almost no change in amount of coupling according to a result of changing "I2", which is the width of the horizontal resonator tunnel 281 or the resonator extension tunnel 283, and "J2", which is the spacing distance between the partition slots 270a and 270b with the vertical resonator tunnel 282 interposed therebetween.

Therefore, it can be seen that the change in amount of cross-coupling using the resonator tunnel 280 between the second resonator post 232 and the fifth resonator post 235 substantially depends on the size of H2 which is the depth of the horizontal resonator tunnel 281.

Figure 7A:
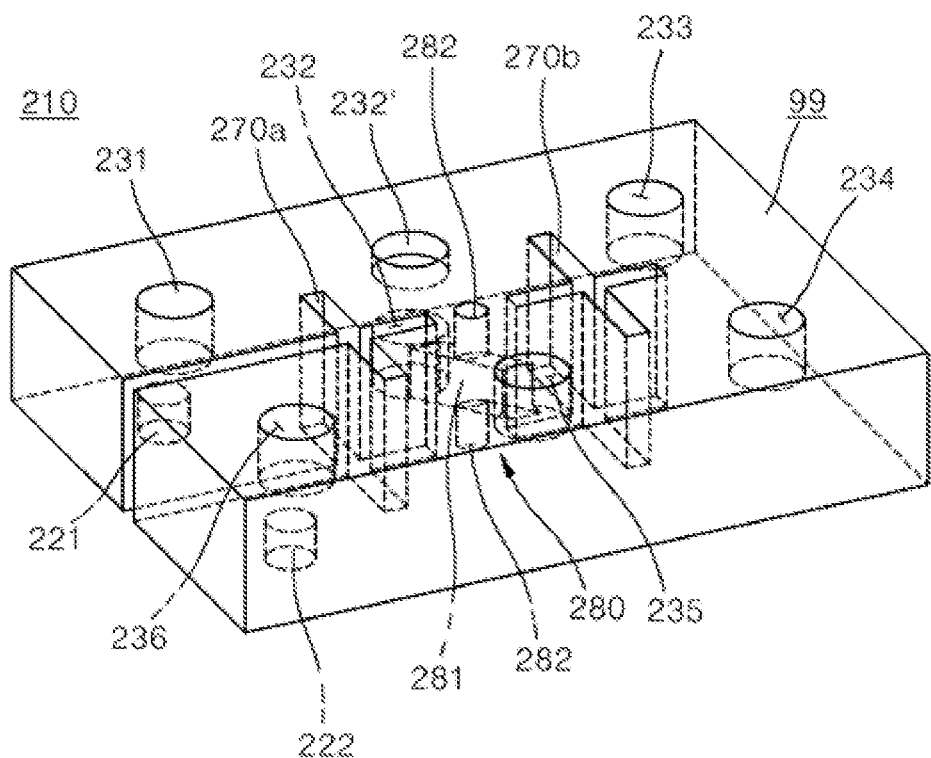
FIGS. 7A to 7C are schematic views illustrating various application examples of the resonator tunnel in the configuration of the waveguide filter according to the embodiment of the present invention.
Figure 7B:
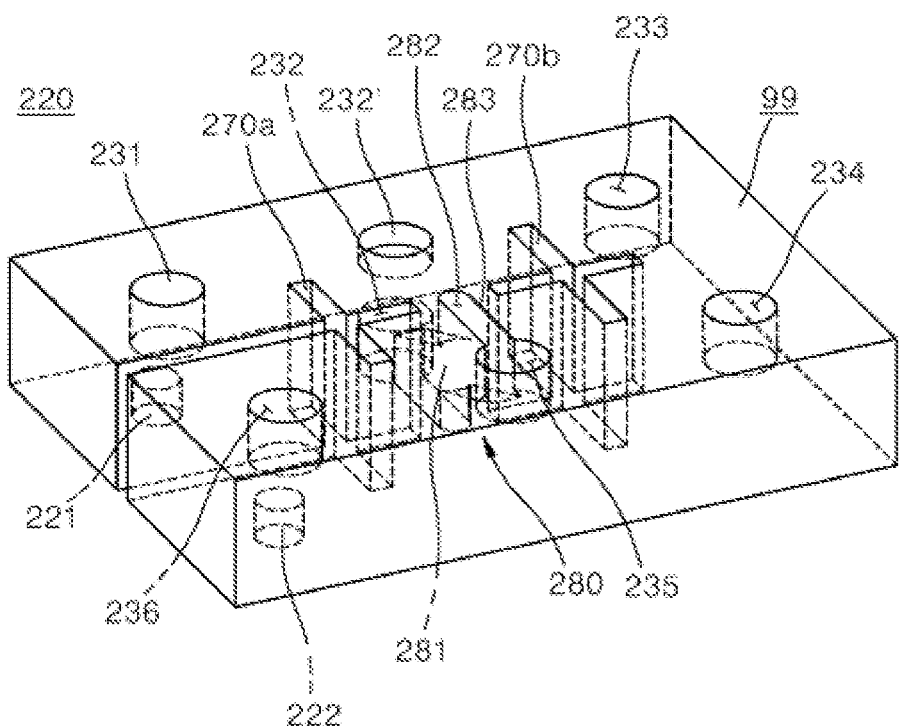
Figure 7C:
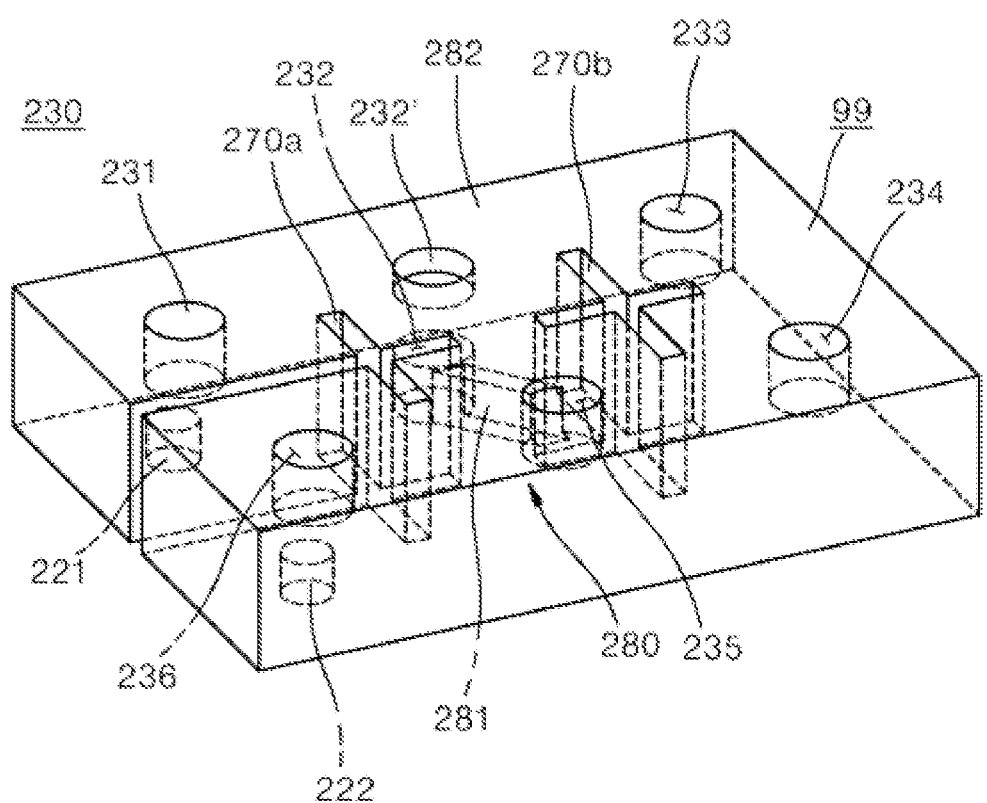

FIGS. 7A to 7C are schematic views illustrating various application examples of the resonator tunnel in the configuration of the waveguide filter according to the embodiment of the present invention.

As illustrated in FIGS. 1A to 3B, in the waveguide filter 100 according to the embodiment of the present invention, the horizontal resonator tunnel 81 of the resonator tunnel 80 may be formed horizontally in the width direction of the filter housing 99, the resonator extension tunnel 83 extends to be opened in the direction from one side of the horizontal resonator tunnel 81 to one surface of the filter housing 99 or opened in the direction from the other side of the horizontal resonator tunnel 81 to the other surface of the filter housing 99, and the vertical resonator tunnel 82 may penetrate one surface and the other surface of the filter housing 99 and be penetratively formed to pass through the horizontal resonator tunnel 81.

However, as described above, the shape of the resonator tunnel 80 is not limited to the shape described in the embodiment of the present invention 100. As illustrated in FIGS. 7A to 7C, various application examples may be made.

That is, as illustrated in FIG. 7A, a waveguide filter 210 according to a first application example does not have a component corresponding to the resonator extension tunnel of the resonator tunnel 280. The horizontal resonator tunnel 281 of the resonator tunnel 280 may extend inclinedly, instead of extending horizontally in the width direction of the filter housing 99, and connect the second resonator post 232 and the fifth resonator post 235 which are reversed with respect to each other. In this case, the vertical resonator tunnel 282 of the resonator tunnel 280 may have the same structure as the shape of the embodiment 100.

Further, as illustrated in FIG. 7B, a waveguide filter 220 according to a second application example also has the resonator extension tunnel 283 of the resonator tunnel 280, like the waveguide filter 100 according to the above-mentioned embodiment. Like the waveguide filter 210 according to the first application example, the horizontal resonator tunnel 281 of the resonator tunnel 280 may extend inclinedly, instead of extending horizontally in the width direction of the filter housing 99, and connect the second resonator post 232 and the fifth resonator post 235 which are reversed with respect to each other. Likewise, the vertical resonator tunnel 282 of the resonator tunnel 280 may have the same structure as the shapes of the embodiment 100 and the first application example 210.

Further, as illustrated in FIG. 7C, a waveguide filter 230 according to a third application example does not have components corresponding to the resonator extension tunnel and the vertical resonator tunnel of the resonator tunnel 280 but have only the horizontal resonator tunnel 281 of the resonator tunnel 280. As in the first application example 210 and the second application example 220, the horizontal resonator tunnel 281 may extend inclinedly, instead of extending horizontally in the width direction of the filter housing 99, and connect the second resonator post 232 and the fifth resonator post 235 which are reversed with respect to each other.

Figure 8:
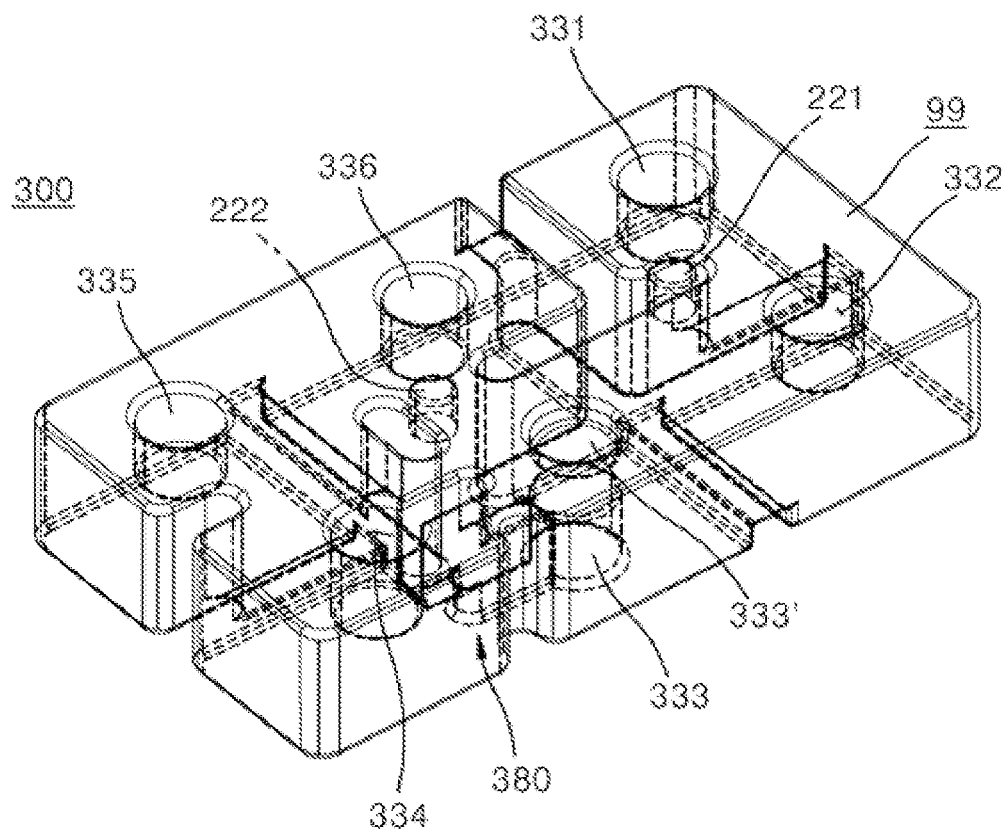
FIG. 8 is a schematic view illustrating a resonator tunnel provided to implement vicinal coupling according to another embodiment of the present invention.
Figure 9:
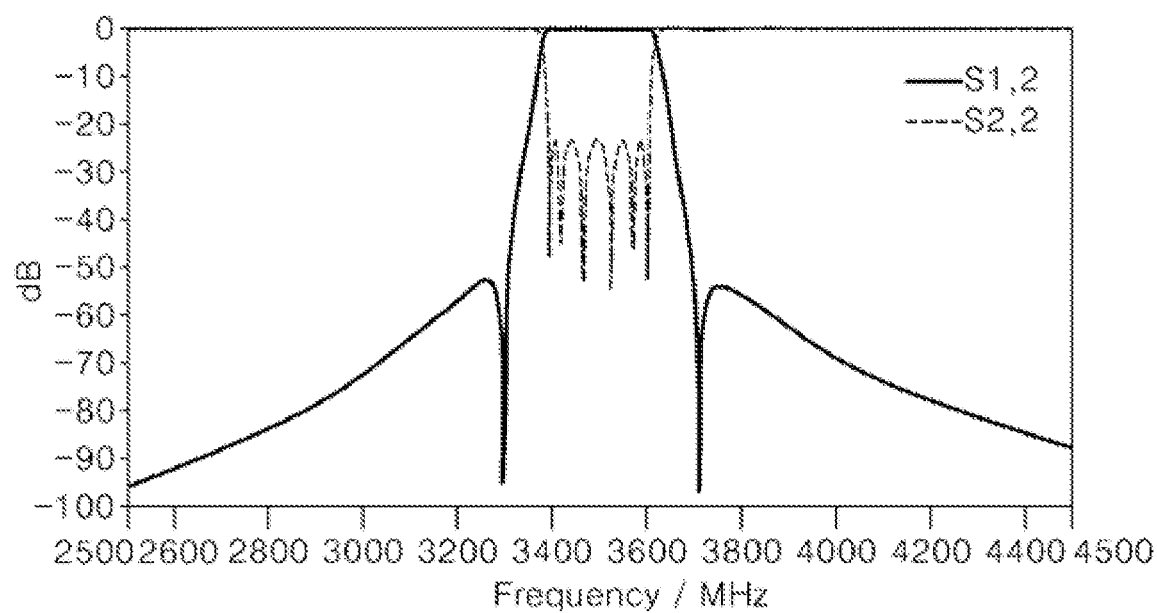
FIG. 9 is a graph illustrating a plot related to frequency properties of a waveguide filter according to another embodiment illustrated in FIG. 8.

FIG. 8 is a schematic view illustrating a resonator tunnel provided to implement vicinal coupling according to another embodiment of the present invention, and FIG. 9 is a graph illustrating a plot related to frequency properties of a waveguide filter according to another embodiment illustrated in FIG. 8.

As illustrated in FIGS. 1A to 3B, the waveguide filter according to the embodiment of the present invention has been described as being subjected to cross-coupling by selecting the two resonator posts (the second resonator post 32 and the ninth resonator post 39) among the plurality of resonator posts 31 to 40.

However, it is not necessary to necessarily apply the cross-coupling to the two resonator posts reversed with respect to each other, and it is possible to apply the vicinal coupling as illustrated in FIG. 8.

That is, as illustrated in FIG. 8, a waveguide filter 300 according to another embodiment of the present invention may be configured such that a resonator tunnel 380 is used to connect the third resonator post 333 and the fourth resonator post 334 reversed with respect to each other and disposed adjacent to each other on the signal line formed between the input post 221 and the output post 222, such that a designer may implement desired notches by using the vicinal coupling of the adjacent resonator posts 333 and 334.

In more detail, as illustrated in FIG. 8, the waveguide filter 300 according to another embodiment of the present invention is configured such that a first resonator post 331, a second resonator post 332, a third resonator post 333, a fourth resonator post 334, a fifth resonator post 335, and a sixth resonator post 336 are provided on six resonance blocks, respectively, an input post 321 is provided to be directed in the direction of the other surface of the filter housing 99 opposite to the direction in which the first resonator post 331 is formed, and an output post 322 is provided to be directed in the direction of the other surface of the filter housing 99 opposite to the direction in which the sixth resonator posts 336 are formed.

In this case, among the resonator posts disposed adjacent to one another on the signal line extending from the input post 321 to the output post 322, the third resonator post 333 may be installed in the direction of the other surface of the filter housing 99 so as to be reversed with respect to the other resonator posts 331, 332, 334, 335, and 336, and the fourth resonator post 334 disposed adjacent to the third resonator post 333 may be connected to the third resonator post 333 by means of the resonator tunnel 380, thereby implementing the vicinal coupling.

In the case of the waveguide filter 100 according to the embodiment of the present invention which is implemented by the cross-coupling, the two notches are implemented at each of the two opposite left and right sides of the passband. In contrast, in the case of the waveguide filter 300 according to another embodiment of the present invention configured as described above, only one notch is implemented at each of the two opposite right and left sides of the passband, as illustrated in FIG. 9. Accordingly, the waveguide filters 100 and 300 have different result values.

The waveguide filter 100 according to the embodiment of the present invention has been described in detail above with reference to the drawings. However, the present invention is not necessarily limited by the embodiment, and various modifications of the embodiment and any other embodiments equivalent thereto may of course be carried out by those skilled in the art to which the present invention pertains. Accordingly, the true protection scope of the present invention should be determined by the appended claims.

INDUSTRIAL APPLICABILITY

The present invention provides the waveguide filter, in which properties of the particular passband are enhanced by implementing coupling by using the resonator tunnel that connects the resonator posts.

The invention claimed is:

1. A waveguide filter comprising:
   a filter housing having a plurality of resonance blocks;
   a plurality of resonators comprising resonator posts respectively formed on the resonance blocks provided on the filter housing; and
   a resonator tunnel provided in the filter housing and configured to connect first and second resonator posts, among the plurality of resonator posts, wherein the first resonator post is provided on one surface and the second resonator post is provided on the other surface of the filter housing so as to be reversed with respect to each other,
   wherein the first and second resonator posts connected by the resonator tunnel are disposed to be reversed with respect to each other to enable cross-coupling.

2. The waveguide filter of claim 1, wherein the first and second resonator posts connected by the resonator tunnel are disposed to be reversed with respect to each other to enable vicinal coupling.

3. The waveguide filter of claim 1, wherein the resonator tunnel comprises a horizontal resonator tunnel disposed in the filter housing and penetrates the filter housing in a width direction or a longitudinal direction and connect the first and second resonator posts.

4. The waveguide filter of claim 3, wherein the resonator tunnel further comprises a vertical resonator tunnel configured to vertically penetrate the filter housing and connected to the horizontal resonator tunnel.

5. The waveguide filter of claim 4, wherein the resonator tunnel further comprises a resonator extension tunnel extending from the horizontal resonator tunnel and opened in a direction of one surface or the other surface of the filter housing.

6. The waveguide filter of claim 3, wherein the horizontal resonator tunnel is inclined in the width direction of the filter housing.

7. The waveguide filter of claim 1, wherein the resonator tunnel is formed in the filter housing so as to be mirror-symmetric with respect to a center between the first and second resonator posts.

8. The waveguide filter of claim 1, wherein a tuning resonator post for tuning adjustment is further provided on a surface of any one of the first and second resonator posts, the surface facing the filter housing.

9. The waveguide filter of claim 1, wherein the plurality of resonance blocks is separated by plurality of partition walls or a plurality of partition slots formed between the respective resonance blocks.

10. The waveguide filter of claim 1, wherein the resonator tunnel connects the first and second resonator posts, which are adjacent to each other in a longitudinal direction of the filter housing, to apply vicinal coupling to the first and second resonator posts.

11. The waveguide filter of claim 1, wherein a notch is formed by inductive coupling by the resonator tunnel, and a formation position of the notch is adjusted by a shape and size of the resonator tunnel.

12. A waveguide filter comprising:
    a filter housing having a plurality of resonance blocks;
    a plurality of resonators comprising resonator posts respectively formed on the resonance blocks provided on the filter housing; and
    a resonator tunnel provided in the filter housing and configured to connect first and second resonator posts, among the plurality of resonator posts, wherein the first resonator post is provided on one surface and the second resonator post is provided on the other surface of the filter housing so as to be reversed with respect to each other,
    wherein the resonator tunnel connects the first and second posts, which are adjacent to each other in a width direction of the filter housing, to apply cross-coupling to the first and second resonator posts.

13. A waveguide filter comprising:
    a filter housing having a plurality of resonance blocks;
    a plurality of resonators comprising resonator posts respectively formed on the resonance blocks provided on the filter housing; and
    a resonator tunnel provided in the filter housing and configured to connect first and second resonator posts, among the plurality of resonator posts, wherein the first resonator post is provided on one surface and the second resonator post is provided on the other surface of the filter housing so as to be reversed with respect to each other,
    wherein a longitudinal axis of the first resonator post and a longitudinal axis of the second resonator post are offset from each other in a direction perpendicular to the longitudinal axes.

14. The waveguide filter of claim 13, wherein the first and second resonator posts connected by the resonator tunnel are disposed to be reversed with respect to each other to enable vicinal coupling.

15. The waveguide filter of claim 13, wherein the resonator tunnel comprises a horizontal resonator tunnel disposed in the filter housing and penetrates the filter housing in a width direction or a longitudinal direction and connect the first and second resonator posts.

16. The waveguide filter of claim 15, wherein the resonator tunnel further comprises a vertical resonator tunnel configured to vertically penetrate the filter housing and connected to the horizontal resonator tunnel.

17. The waveguide filter of claim 16, wherein the resonator tunnel further comprises a resonator extension tunnel extending from the horizontal resonator tunnel and opened in a direction of one surface or the other surface of the filter housing.

18. The waveguide filter of claim 15, wherein the horizontal resonator tunnel is inclined in the width direction of the filter housing.

19. The waveguide filter of claim 13, wherein the resonator tunnel is formed in the filter housing so as to be mirror-symmetric with respect to a center between the first and second resonator posts.

* * * * *